(12) United States Patent
Takahashi et al.

(10) Patent No.: US 6,169,684 B1
(45) Date of Patent: Jan. 2, 2001

(54) SEMICONDUCTOR MEMORY DEVICE

(75) Inventors: Kazunari Takahashi, Shiga; Masashi Agata, Osaka; Naoki Kuroda, Kyoto; Tsutomu Fujita, Osaka, all of (JP)

(73) Assignee: Matsushita Electric Industrial Co., Ltd., Osaka (JP)

( * ) Notice: Under 35 U.S.C. 154(b), the term of this patent shall be extended for 0 days.

(21) Appl. No.: 09/495,473

(22) Filed: Feb. 1, 2000

(30) Foreign Application Priority Data

Feb. 2, 1999 (JP) .................................................. 11-024813

(51) Int. Cl.[7] .................................................. G11C 15/00
(52) U.S. Cl. ............................................. 365/49; 365/149
(58) Field of Search ............................ 365/49, 149, 196, 365/230.03

(56) References Cited

U.S. PATENT DOCUMENTS

| 5,781,466 | * | 7/1998 | Tanaka et al. | 365/49 |
| 5,844,856 | * | 12/1998 | Taylor | 365/230.05 |
| 5,856,940 | | 1/1999 | Rao | 365/149 |
| 5,923,593 | | 7/1999 | Hsu et al. | 365/189.04 |
| 5,963,497 | * | 10/1999 | Holland | 365/222 |

OTHER PUBLICATIONS

Katsumi Dosaka, et al., "A 100–MHz 4–Mb Cache DRAM with Fast Copy Back Scheme", IEEE Journal of Solid–State Circuits, vol. 27, No. 11, Nov. 1992, pp. 1534–1539.

* cited by examiner

*Primary Examiner*—Richard Elms
*Assistant Examiner*—Anh Phung
(74) *Attorney, Agent, or Firm*—McDermott, Will & Emery (57) ABSTRACT

A cache memory including a first memory array and a main memory including a second memory array are integrated together on the same semiconductor substrate. Each memory cell in the first memory array is of a 2Tr1C type including: first and second transistors, the sources of which are connected together; and a data storage capacitor, one of the two electrodes of which is connected to the common source of the first and second transistors. Each memory cell in the second memory array is of a 1Tr1C type including: a third transistor; and a data storage capacitor, one of the two electrodes of which is connected to the source of the third transistor.

6 Claims, 7 Drawing Sheets

SEMICONDUCTOR MEMORY DEVICE

BACKGROUND OF THE INVENTION

The present invention relates to a hybrid semiconductor memory device, in which two types of memories with dissimilar functions are integrated together on the same semiconductor chip.

In a known semiconductor memory device, an array of memory cells, each including a transistor and a data storage capacitor that is connected to the source of the transistor, is formed on a semiconductor chip.

A conventional semiconductor memory device like this has the following drawbacks. Firstly, the random access speed of such a device is delimited by the performance of the memory cells. Secondly, although an external cache memory should be additionally provided for the device to improve the overall system performance thereof, the size of the system increases in such a case, thus raising the overall system cost correspondingly.

To solve these problems, a hybrid semiconductor memory device, in which an SRAM cache memory and a DRAM main memory are integrated together on a single semiconductor chip, was proposed in IEEE Journal of Solid State Circuits Vol. 27, No. 11, pp. 1534–1539, November 1992.

However, such a semiconductor memory device, which includes, on a single chip, two types of memories with dissimilar functions, e.g., the SRAM cache and DRAM main memories, occupies a greater area. This is because the size of an SRAM is about 10 times larger than that of a DRAM.

In addition, since the SRAM and DRAM have mutually different memory cell constructions, the layout and design processes of such a cache/main memory hybrid device become too complicated.

SUMMARY OF THE INVENTION

An object of the present invention is reducing the area of a hybrid semiconductor memory device including two types of memories with dissimilar functions on a single chip.

Another object of the present invention is simplifying the layout and design processes of such a memory device.

To achieve these objects, a semiconductor memory device according to the present invention includes first and second memory arrays integrated together on a single semiconductor chip. The first memory array is made up of memory cells of a first type, while the second memory array is made up of memory cells of a second type. Each said memory cell of the first type includes: first and second transistors, the sources of which are connected together; and a first data storage capacitor, one of two electrodes of which is connected to the source. Each said memory cell of the second type includes: a third transistor; and a second data storage capacitor connected to the source of the third transistor. The first memory array includes: a first bit line connected to respective drains of the first transistors; and a second bit line connected to respective drains of the second transistors. The second memory array includes: a third bit line connected to respective drains of the third transistors; and a fourth bit line, which is connected to respective drains of fourth transistors and is paired with the third bit line. Each said fourth transistor is adjacent to associated one of the third transistors. The first and second bit lines are parallel to each other. The third and fourth bit lines are parallel to each other. And a pitch defined between the first and second bit lines is equal to a pitch defined between the third and fourth bit lines.

In the semiconductor memory device according to the present invention, in which first and second memory arrays with dissimilar functions are integrated together on a single semiconductor chip, each memory cell belonging to the first memory array includes: first and second transistors, the sources of which are connected together; and a first data storage capacitor, one of two electrodes of which is connected to the source. Thus, the area occupied by the first memory array, and the overall area of the semiconductor memory device, can be greatly reduced. In addition, the semiconductor memory device is accessible at a far higher speed and the storage capacity thereof can be much increased.

Also, in the semiconductor memory device according to the present invention, a pitch defined between the first and second bit lines in the first memory array is equal to a pitch defined between the third and fourth bit lines in the second memory array. Thus, although first and second memory arrays with mutually different functions are integrated together on the same semiconductor chip, the interconnection layout can be simplified, so is the fabrication process thereof.

In one embodiment of the present invention, the memory device may further include: a first sense amplifier with one terminal connected to the first bit line; a second sense amplifier with one terminal connected to the second bit line; a third sense amplifier with one terminal connected to the third bit line; and means for transferring data from the first to second memory array, or vice versa. The transfer means includes first and second data transfer lines. The first data transfer line is preferably connected to the one terminal of the first sense amplifier and to the one terminal of the third sense amplifier via respective switches. The second data transfer line is preferably connected to the other terminal of the second sense amplifier and to the other terminal of the third sense amplifier via respective switches.

In such an embodiment, the first and second data transfer lines can be placed in parallel to each other. In addition, the first and second data transfer lines and the first, second and third bit lines can all be placed in parallel to each other. Accordingly, even though this memory device includes the means for transferring data between the first and second memory arrays with mutually different functions, the interconnection layout can be simplified.

In another embodiment, the first memory array may be implemented as cache memory core, and the second memory array may be implemented as main memory core.

In such an embodiment, the operating speed and storage capacity of a cache/main memory hybrid device can be both increased and yet the layout thereof can be simplified.

In an alternative embodiment, the first memory array may be implemented as register core, and the second memory array may be implemented as main memory core.

In such an embodiment, the operating speed and storage capacity of a register/main memory hybrid device can be both increased and yet the layout thereof can be simplified.

In still another embodiment, the memory device may further include: a first complementary bit line paired with the first bit line; a second complementary bit line paired with the second bit line; a first sense amplifier with one terminal connected to the first bit line and the other terminal connected to the first complementary bit line; and a second sense amplifier with one terminal connected to the second bit line and the other terminal connected to the second complementary bit line. The first complementary bit line and the first bit line preferably extend from the first sense amplifier in mutually opposite directions, and the second complementary bit line and the second bit line preferably extend from the second sense amplifier in mutually opposite directions.

In such an embodiment, the bit lines can be arranged according to an open configuration. Thus, the first array of memory cells of the first type, each including two transistors and one capacitor, can get its layout simplified.

In still another embodiment, the memory device may further include: a first word line connected to respective gates of the first transistors; a second word line connected to respective gates of the second transistors; a third word line connected to respective gates of the third transistors; and a fourth word line connected to respective gates of the fourth transistors. The first and second word lines are preferably parallel to each other. The third and fourth word lines are preferably parallel to each other. And a pitch defined between the first and second word lines is preferably equal to a pitch defined between the third and fourth word lines.

In such an embodiment, the interconnection layout can be further simplified.

DESCRIPTION OF THE PREFERRED EMBODIMENTS

EMBODIMENT 1

Hereinafter, a semiconductor memory device according to a first embodiment of the present invention will be described with reference to FIGS. 1, 4, 5, 6 and 7.

Figure 1:
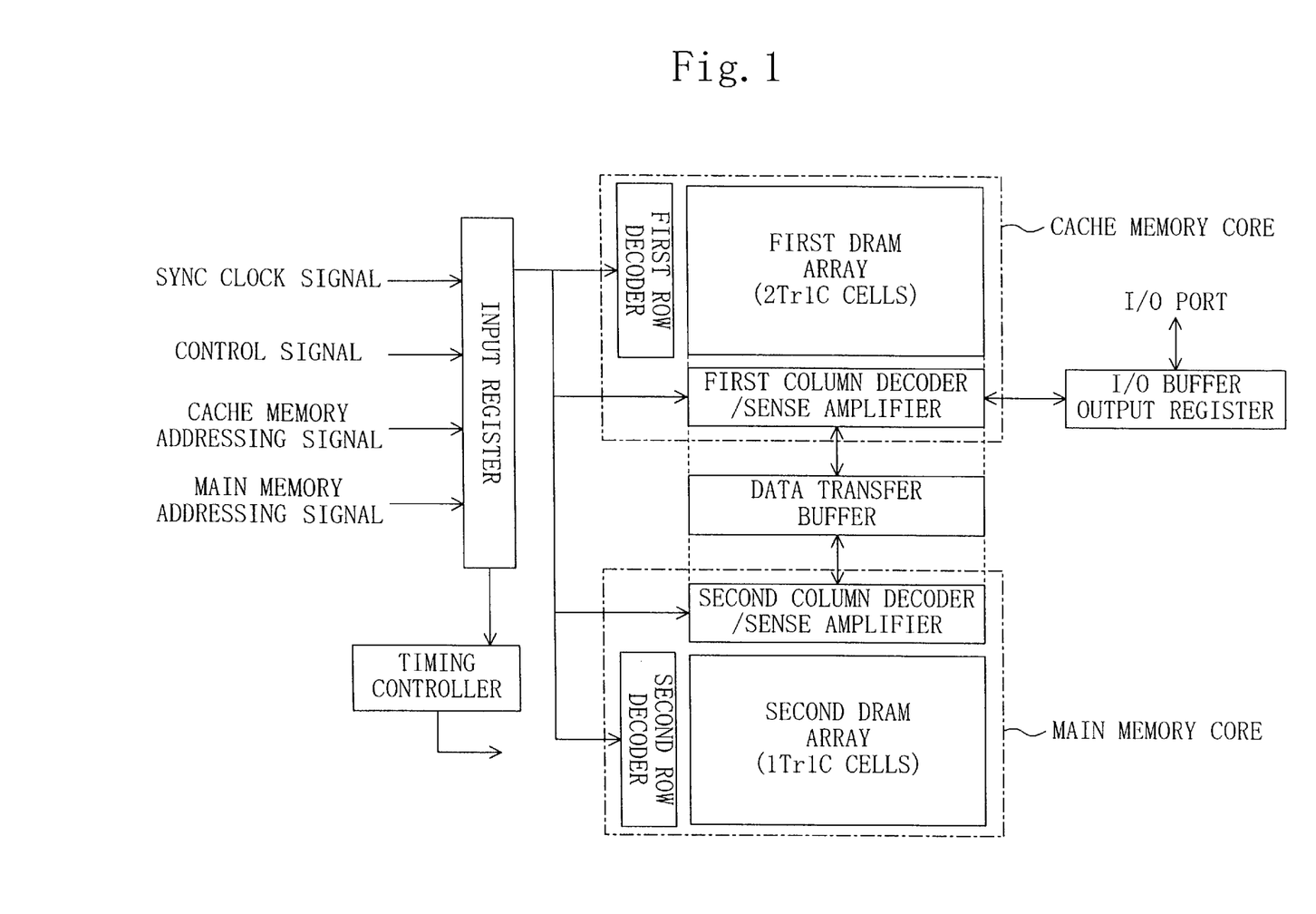
FIG. 1 is a block diagram illustrating an overall arrangement of a semiconductor memory device according to a first embodiment of the present invention.

FIG. 1 illustrates an overall arrangement of the semiconductor memory device according to the first embodiment.

As shown in FIG. 1, the semiconductor memory device of the first embodiment includes a cache memory core and a main memory core that are integrated together on the same semiconductor chip. The cache memory core includes: first DRAM array; first row decoder; and first column decoder/sense amplifier. In the first DRAM array, each memory cell includes two, or first and second, transistors and one data storage capacitor. In this specification, a memory cell of this type will be called a "2Tr1C memory cell". The main memory core includes: second DRAM array; second row decoder; and second column decoder/sense amplifier. In the second DRAM array, each memory cell includes one transistor and one data storage capacitor. In this specification, a memory cell of this type will be called a "1Tr1C memory cell".

Responsive to sync clock, control, cache memory addressing and main memory addressing signals, an input register outputs first row address, first column address, second row address and second column address signals to the first row decoder, first column decoder/sense amplifier, second row decoder and second column decoder/sense amplifier, respectively.

Data is exchanged between the first column decoder/sense amplifier in the cache memory core and the second column decoder/sense amplifier in the main memory core by way of a data transfer buffer. Also, data is input through an I/O port to the first column decoder/sense amplifier by way of an I/O buffer output register or output from the first column decoder/sense amplifier through the I/O port by way of the I/O buffer output register.

Responsive to a timing control signal provided from the input register, a timing controller transfers, inputs or outputs data.

Figure 4:
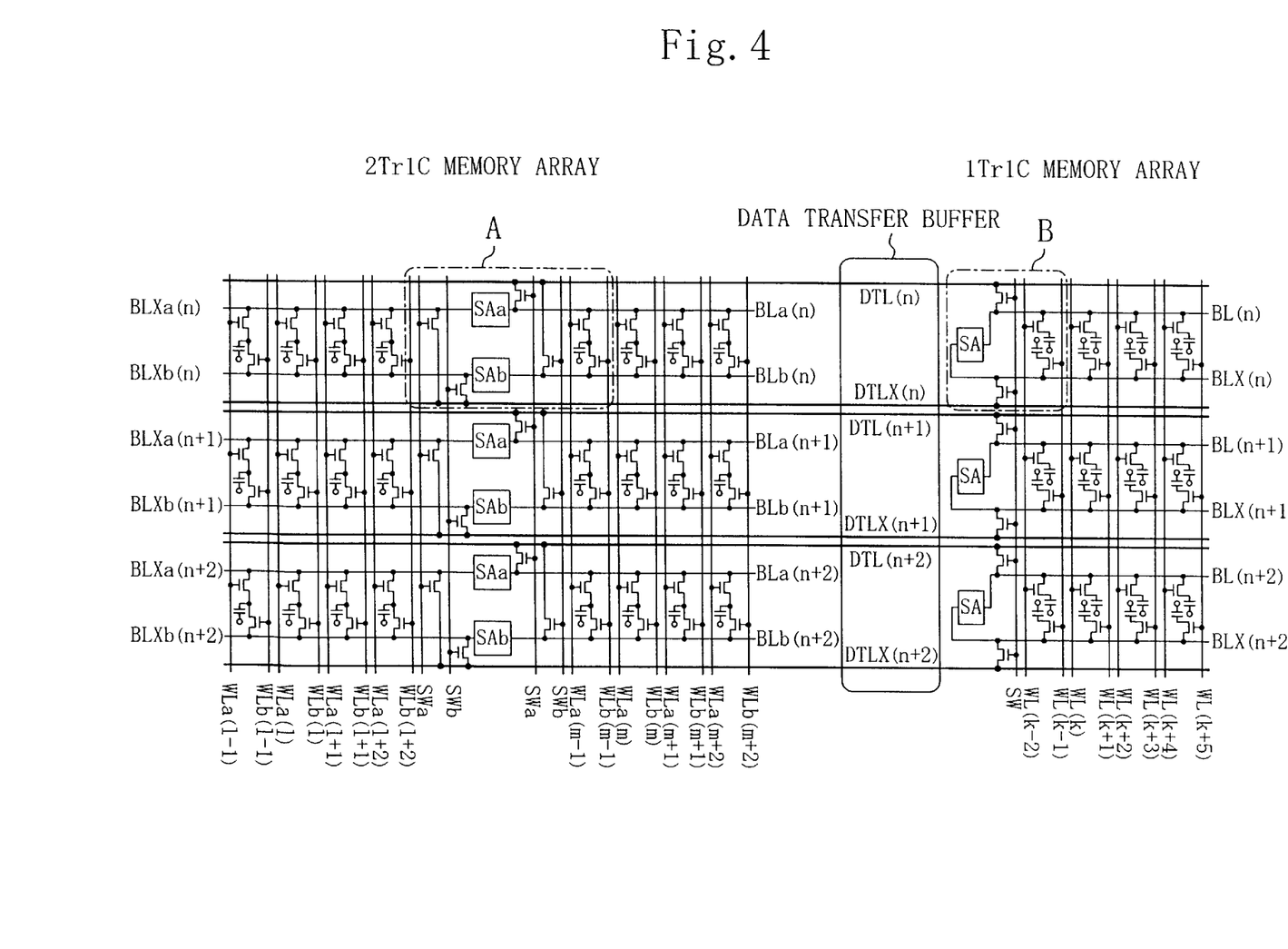
FIG. 4 illustrates a circuit configuration of the semiconductor memory device according to the first embodiment.
Figure 5A:
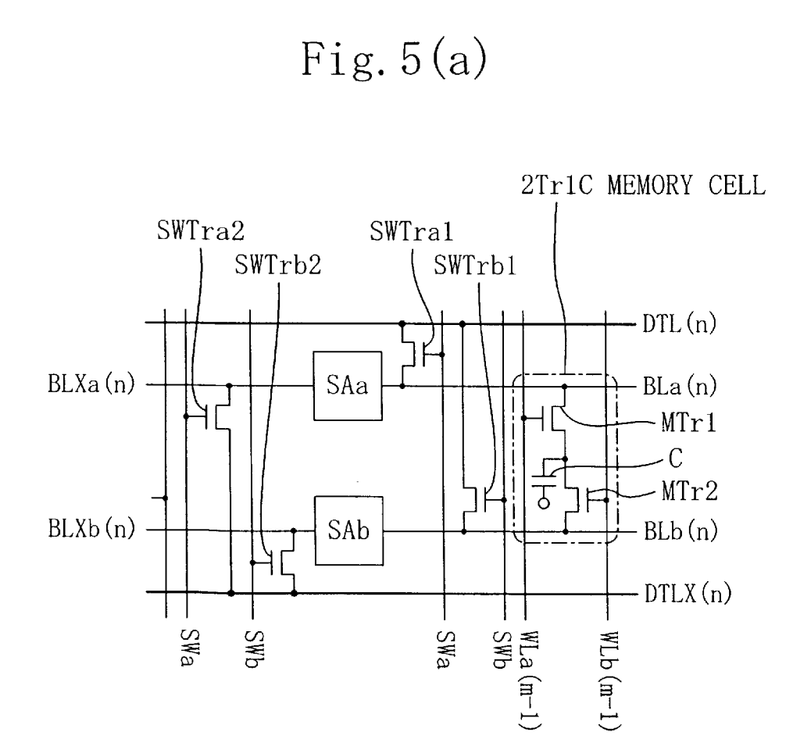
FIG. 5(a) illustrates, on a larger scale, section A shown in FIG. 4, which is a part of the first array of 2Tr1C memory cells.
Figure 5B:
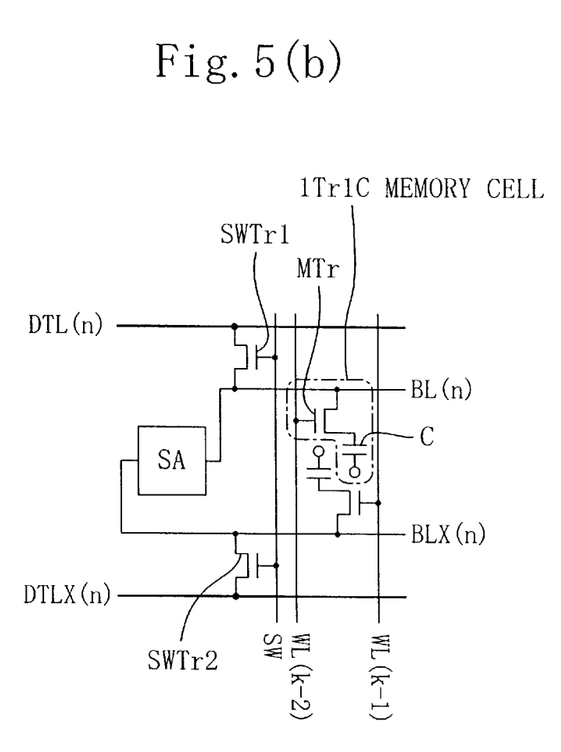
FIG. 5(b) illustrates, on a larger scale, section B shown in FIG. 4, which is a part of the second array of 1Tr1C memory cells.
Figure 6A:
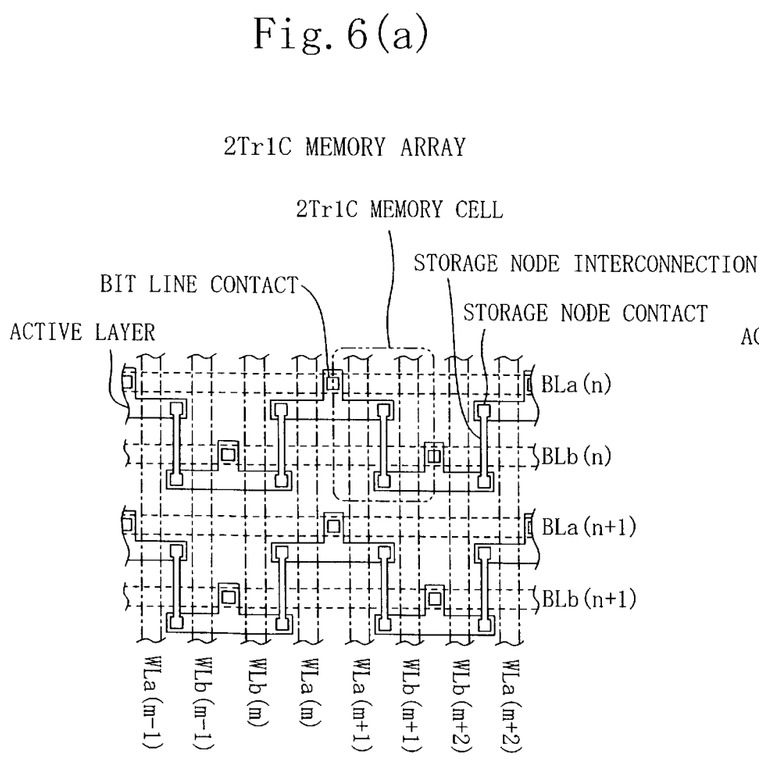
FIG. 6(a) illustrates a layout pattern for the first array of 2Tr1C memory cells.

FIG. 4 illustrates a circuit configuration of the semiconductor memory device according to the first embodiment. FIG. 5(a) illustrates, on a larger scale, section A shown in FIG. 4, which is a part of the first array of 2Tr1C memory cells. FIG. 5(b) illustrates, on a larger scale, section B shown in FIG. 4, which is a part of the second array of 1Tr1C memory cells. FIG. 6(a) illustrates a layout pattern for the first array of 2Tr1C memory cells. And FIG. 6(b) illustrates a layout pattern for the second array of 1Tr1C memory cells.

As shown in FIGS. 5(a) and 6(a), each 2Tr1C memory cell of the first type includes first and second transistors MTr1 and MTr2 and a data storage capacitor C. The sources of the first and second transistors MTr1 and MTr2 are connected together. One of the two electrodes of the capacitor C is connected to the common source of the first and second transistors MTr1 and MTr2.

As shown in FIG. 4, the first memory array includes: first bit lines BLa(n), BLa(n+1) and BLa(n+2), each of which is connected to respective drains of associated first transistors MTr1; and first complementary bit lines BLXa(n), BLXa(n+1) and BLXa(n+2) that are paired with the first bit lines BLa(n), BLa(n+1) and BLa(n+2), respectively. First sense amplifiers SAa are provided between the first bit lines BLa(n), BLa(n+1) and BLa(n+2) and the first complementary bit lines BLXa(n), BLXa(n+1) and BLXa(n+2). One terminal of each first sense amplifier SAa is connected to the associated first bit line BLa(n), BLa(n+1) or BLa(n+2), while the other terminal thereof is connected to the associated first complementary bit line BLXa(n), BLXa(n+1) or BLXa(n+2). Each pair of first bit line and first complementary bit line BLa(n) and BLXa(n), BLa(n+1) and BLXa(n+1), BLa(n+2) and BLXa(n+2) extend from the first sense amplifier SAa in mutually opposite directions. The first memory array also includes: second bit lines BLb(n), BLb(n+1) and BLb(n+2), each of which is connected to respective drains of associated second transistors MTr2; and second complementary bit lines BLXb(n), BLXb(n+1) and BLXb(n+2) that are paired with the second bit lines BLb(n), BLb(n+1) and BLb(n+2), respectively. Second sense amplifiers SAb are provided between the second bit lines BLb(n), BLb(n+1) and BLb(n+2) and the second complementary bit lines BLXb(n), BLXb(n+1) and BLXb(n+2). One terminal of each second sense amplifier SAb is connected to the associated second bit line BLb(n), BLb(n+1) or BLb(n+2), while the other terminal thereof is connected to the associated second complementary bit line BLXb(n), BLXb(n+1) or BLXb(n+2). Each pair of second bit line and second complementary bit line BLb(n) and BLXb(n), BLb(n+1) and BLXb(n+1), BLb(n+2) and BLXb(n+2) extend from the second sense amplifier SAb in mutually opposite directions. That is to say, the first array of 2Tr1C memory cells has an open bit line configuration.

Figure 6B:
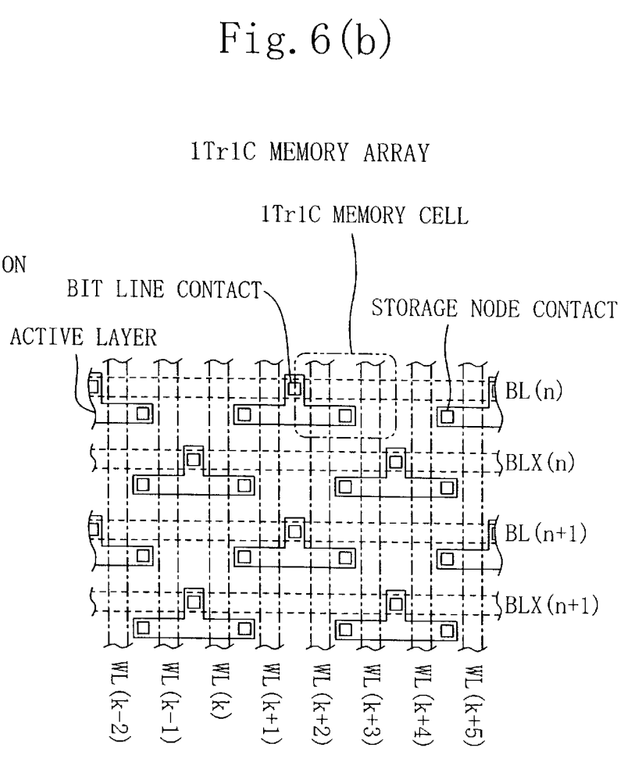
FIG. 6(b) illustrates a layout pattern for the second array of 1Tr1C memory cells.

As shown in FIGS. 5(b) and 6(b), each 1Tr1C memory cell of the second type includes a third transistor MTr and a data storage capacitor C. One of the two electrodes of the capacitor C is connected to the source of the third transistor MTr.

As shown in FIG. 4, the second memory array includes: third bit lines BL(n), BL(n+1) and BL(n+2), each of which is connected to respective drains of associated third transistors MTr; and third complementary bit lines (i.e., fourth bit lines) BLX(n), BLX(n+1) and BLX(n+2) that are paired with the third bit lines BL(n), BL(n+1) and BL(n+2), respectively. Third sense amplifiers SA are provided between the third bit lines BL(n), BL(n+1) and BL(n+2) and the third complementary bit lines BLX(n), BLX(n+1) and BLX(n+2). One terminal of each third sense amplifier SA is connected to the associated third bit line BL(n), BL(n+1) or BL(n+2), while the other terminal thereof is connected to the associated third complementary bit line BLX(n), BLX(n+1) or BLX(n+2). Each pair of third 15 bit line and third complementary bit line BL(n) and BLX(n), BL(n+1) and BLX(n+1), BL(n+2) and BLX(n+2) extend from the third sense amplifier SA in the same direction. In other words, the second array of 1Tr1C memory cells has a folded bit line configuration.

As shown in FIG. 4, first word lines WLa(l-1), WLa(l), WLa(l+1), WLa(l+2), . . . , WLa(m-1), WLa(m), WLa(m+1) and WLa(m+2), each of which is connected to respective gates of associated first transistors MTr1, and second word lines WLb(1-1), WLb(1), WLb(1+1), WLb(1+2), . . . , WLb(m-1), WLb(m), WLb(m+1) and WLb(m+2), each of which is connected to respective gates of associated second transistors MTr2, are parallel to each other in the first memory array. In the second memory array on the other hand, third word lines WL(k-2), L(k), WL(k+2) and WL(k+4), each of which is connected to respective gates of associated third transistors MTr, and fourth word lines WL(k-1), WL(k+1), WL(k+3) and WL(k+5), each of which is connected to respective gates of associated fourth transistors adjacent to the third transistors MTr, are parallel to each other.

As shown in FIGS. 6(a) and 6(b), a pitch defined between the first and second bit lines in the first array of 2Tr1C memory cells, a pitch defined between the first and second complementary bit lines in the first array, and a pitch defined between the third bit line and third complementary bit line in the second array of 1Tr1C memory cells are set equal to each other. In addition, a pitch defined between the first and second word lines in the first array and a pitch defined between the third and fourth word lines in the second array are also set equal to each other.

As can be seen from FIGS. 6(a) and 6(b), the shapes and sizes of active layers, the widths and pitches of bit lines and the widths and pitches of word lines are equal to each other between the first array of 2Tr1C memory cells and the second array of 1Tr1C memory cells. Also, a pair of storage nodes, which correspond to those of two adjacent memory cells in the second array, are interconnected in the first array, thereby forming the 2Tr1C memory cell.

In the illustrated embodiment, since the first and second memory arrays have open and folded bit line configurations, respectively, a pitch defined between the first and second bit lines in the first array, a pitch defined between the first and second complementary bit lines in the first array, and a pitch defined between the third bit line and third complementary bit line in the second array can be equalized with each other.

As shown in FIGS. 4, 5(a) and 5(b), a first data transfer line DTL(n), which is included in the data transfer buffer, is connected not only to one terminal of the first sense amplifier SAa via a switching transistor SWTra1 but also to one terminal of the third sense amplifier SA via another switching transistor SWTr1. The ON/OFF states of the switching transistor SWTra1 are controlled responsive to a switch control signal Swa, while the ON/OFF states of the switching transistor SWTr1 are controlled responsive to a switch control signal SW.

A second data transfer line DTLX(n), which is also included in the data transfer buffer, is connected not only to one terminal of the second sense amplifier SAb via a switching transistor SWTrb1 but also to the other terminal of the third sense amplifier SA via another switching transistor SWTr2. The ON/OFF states of the switching transistor SWTrb1 are controlled responsive to a switch control signal Swb, while the ON/OFF states of the switching transistor SWTr2 are controlled responsive to the switch control signal SW.

The other terminal of the first sense amplifier SAa is connected to the second data transfer line DTLX(n) via a switching transistor SWTra2, the ON/OFF states of which are controlled responsive to the switch control signal Swa. The other terminal of the second sense amplifier SAb is connected to the first data transfer line DTL(n) via a switching transistor SWTrb1, the ON/OFF states of which are controlled responsive to the switch control signal SWb.

The first and second data transfer lines DTL(n) and DTLX(n) and the switching transistors SWTra1, SWTrb1, SWTra2, SWTrb2, SWTr1 and SWTr2 together constitute the data transfer means for transferring data between the first and second memory arrays.

Figure 7A:
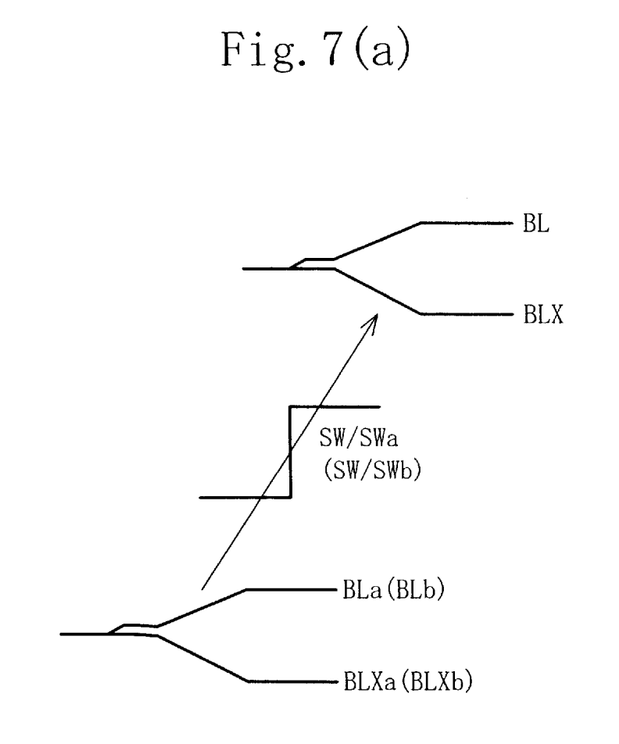
FIG. 7(a) illustrates a timing relationship to be established when data is transferred from the first to second memory array.

FIG. 7(a) illustrates a timing relationship to be established when data is transferred from the first to second memory array. As shown in FIG. 7(a), first bit line BLa and first complementary bit line BLXa (or second bit line BLb and second complementary bit line BLXb) in the first array are amplified by a sense amplifier. Thereafter, the switch control signals SW and SWa (or SW and SWb) are asserted. Then, third bit line BL and third complementary bit line BLX in the second array are amplified by a sense amplifier. As a result, data is transferred from the first to second memory array.

Figure 7B:
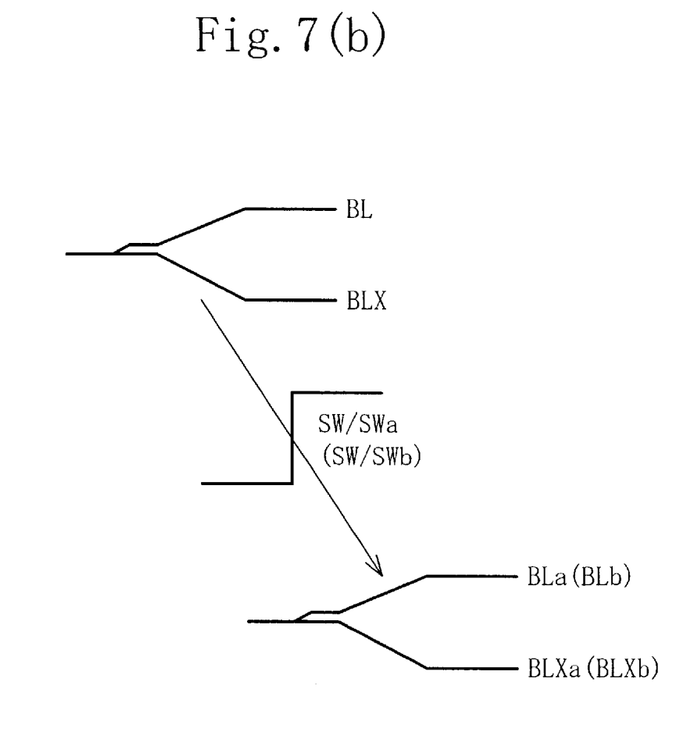
FIG. 7(b) illustrates a timing relationship to be established when data is transferred from the second to first memory array.

FIG. 7(b) illustrates a timing relationship to be established when data is transferred from the second to first memory array. As shown in FIG. 7(b), third bit line BL and third complementary bit line BLX in the second array are amplified by a sense amplifier and then the switch control signals SW and Swa (or SW and SWb) are asserted. In response, first bit line BLa and first complementary bit line BLXa (or second bit line BLb and second complementary bit line BLXb) in the first array are amplified by a sense amplifier. As a result, data is transferred from the second to first memory array.

According to the first embodiment, a pitch defined between the first and second bit lines in the first array, a pitch defined between the first and second complementary bit lines in the first array, and a pitch defined between the third bit line and third complementary bit line in the second array are set equal to each other. In addition, a pitch defined between the first and second word lines in the first array and a pitch defined between the third and fourth word lines in the second array are also set equal to each other. Thus, the same interconnection pattern (or design rules) is applicable to both the first and second memory arrays.

In particular, a pitch defined between the first and second bit lines (or between the first and second complementary bit lines) in the first array and a pitch defined between the third bit line and third complementary bit line in the second array are equal to each other. Accordingly, the first and second data transfer lines used for transferring data between the first and second arrays can be placed in parallel to the first and second bit lines (or the first and second complementary bit lines) in the first array and to the third bit line and third complementary bit line in the second array. As a result, the layout can be simplified.

Modified Example of Embodiment 1

Hereinafter, a semiconductor memory device according to a modified example of the first embodiment will be described with reference to FIG. 2.

Figure 2:
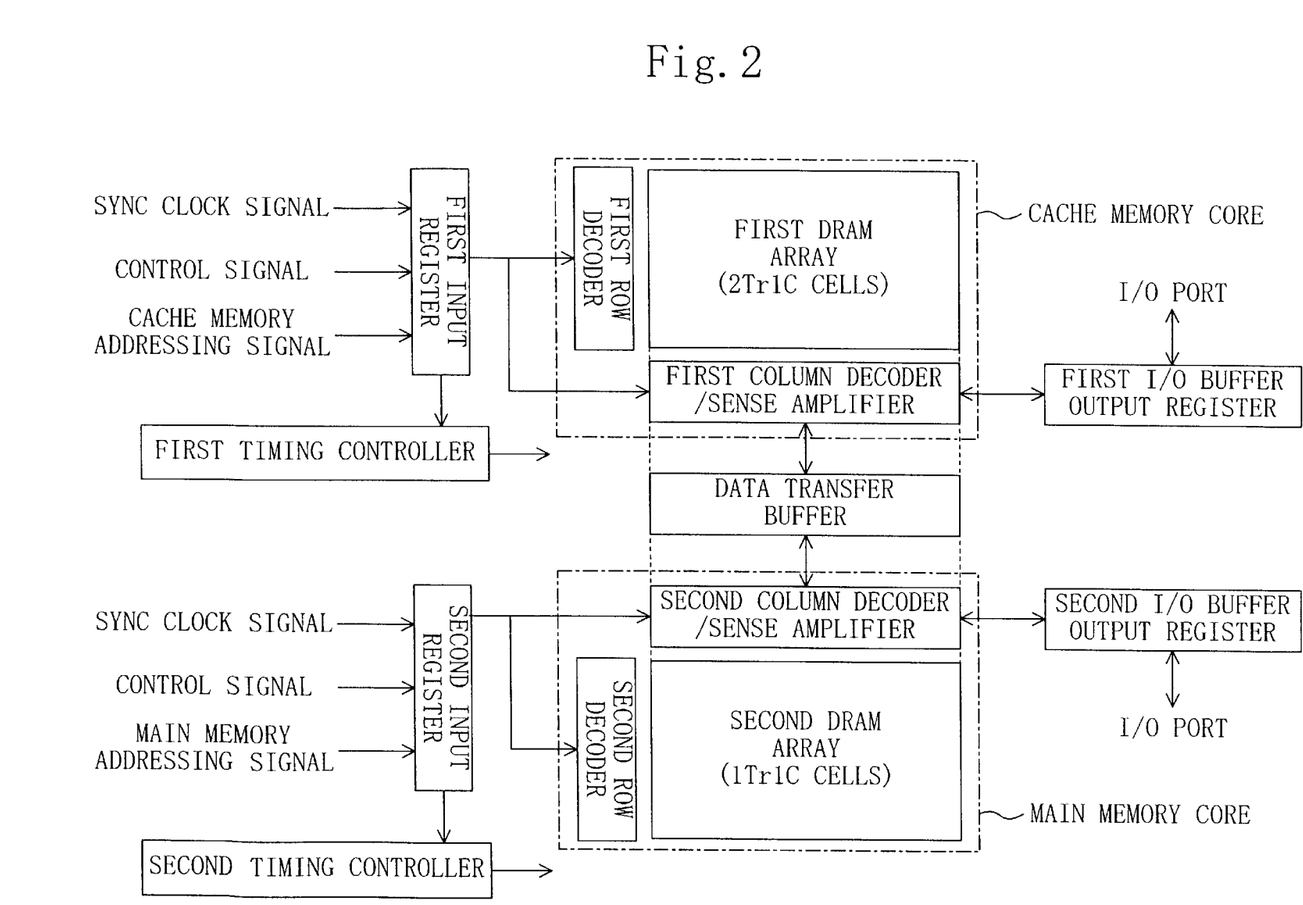
FIG. 2 is a block diagram illustrating an overall arrangement of a semiconductor memory device according to a modified example of the first embodiment.

FIG. 2 illustrates an overall arrangement of a semiconductor memory device according to this modified example of the first embodiment. As shown in FIG. 2, the device of this modified example is different from the device of the first embodiment in that first input register and first I/O buffer output register are provided for the cache memory core and second input register and second I/O buffer output register are provided for the main memory core. The cache and main memory cores have the same configurations as the counterparts of the first embodiment, and the description thereof will be omitted herein.

In response to the sync clock, control and cache memory addressing signals, the first input register outputs first row address and first column address signals to the first row decoder and the first column decoder/sense amplifier, respectively. In the same way, responsive to the sync clock, control and main memory addressing signals, the second input register outputs second row address and second column address signals to the second row decoder and the second column decoder/sense amplifier, respectively.

Data is exchanged between the first column decoder/sense amplifier in the cache memory core and the data transfer buffer. Also, data is input through an I/O port to the first column decoder/sense amplifier by way of the first I/O buffer output register or output from the first column decoder/sense amplifier through the I/O port by way of the first I/O buffer output register. In the same way, data is exchanged between the second column decoder/sense amplifier in the main memory core and the data transfer buffer. Also, data is input through the I/O port to the second column decoder/sense amplifier by way of the second I/O buffer output register or output from the second column decoder/sense amplifier through the I/O port by way of the second I/O buffer output register.

EMBODIMENT 2

Hereinafter, a semiconductor memory device according to a second exemplary embodiment of the present invention will be described with reference to FIG. 3.

Figure 3:
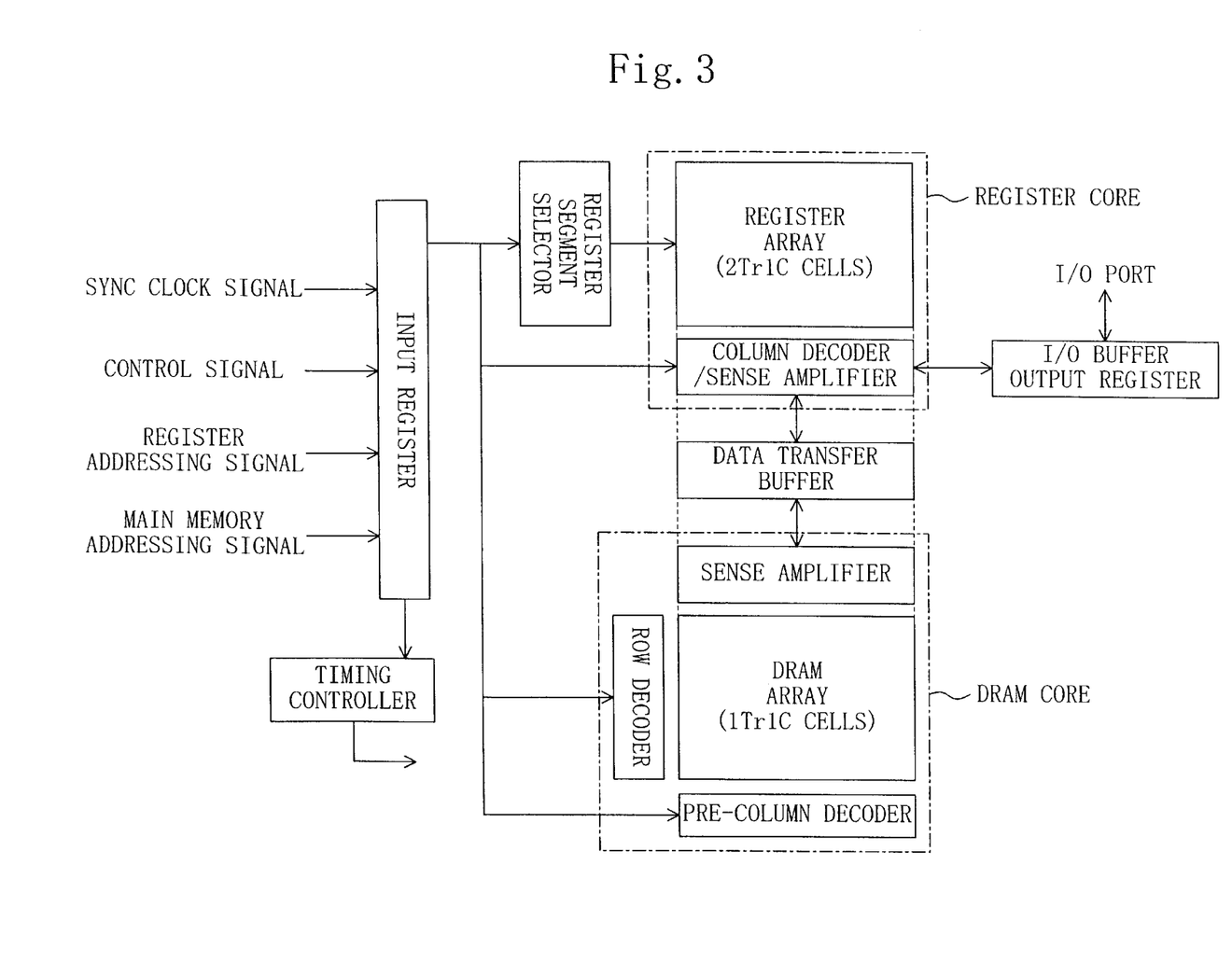
FIG. 3 is a block diagram illustrating an overall arrangement of a semiconductor memory device according to a second embodiment of the present invention.

FIG. 3 illustrates an overall arrangement of the semiconductor memory device according to the second embodiment.

As shown in FIG. 3, the semiconductor memory device of the second embodiment includes a register core and a main memory core that are integrated together on the same semiconductor chip. The register core includes: register array made up of 2Tr1C memory cells; register segment selector; and column decoder/sense amplifier. The main memory core includes: DRAM array made up of 1Tr1C memory cells; row decoder; sense amplifier; and pre-column decoder. The register core implemented as an array of 2Tr1C memory cells has the same configuration as that of the cache memory core according to the first embodiment. Also, the main memory core implemented as an array of 1Tr1C memory cells is the same as the counterpart of the first embodiment. Thus, the description thereof will be omitted herein.

In response to sync clock, control, register addressing and main memory addressing signals, an input register outputs first row address, first column address, second row address and second column address signals to the register segment selector, column decoder/sense amplifier, row decoder and precolumn decoder, respectively.

Data is exchanged between the column decoder/sense amplifier in the register core and a data transfer buffer. Also, data is input through an I/O port to the column decoder/sense amplifier by way of an I/O buffer output register or output from the column decoder/sense amplifier through the I/O port by way of the I/O buffer output register. In addition, data is exchanged between the sense amplifier in the main memory core and the data transfer buffer.

In response to a timing control signal provided from the input register, a timing controller transfers, inputs or outputs data.

What is claimed is:

1. A semiconductor memory device comprising first and second memory arrays integrated together on a single semiconductor chip, the first memory array being made up of memory cells of a first type, the second memory array being made up of memory cells of a second type, wherein each said memory cell of the first type includes: first and second transistors, the sources of which are connected together; and a first data storage capacitor, one of two electrodes of the first capacitor being connected to the source, while each said memory cell of the second type includes: a third transistor; and a second data storage capacitor connected to the source of the third transistor, and wherein the first memory array includes: a first bit line connected to respective drains of the first transistors; and a second bit line connected to respective drains of the second transistors, while the second memory array includes: a third bit line connected to respective drains of the third transistors; and a fourth bit line, which is connected to respective drains of fourth transistors and is paired with the third bit line, each said fourth transistor being adjacent to associated one of the third transistors, and wherein the first and second bit lines are parallel to each other, and wherein the third and fourth bit lines are parallel to each other, and wherein a pitch defined between the first and second bit lines is equal to a pitch defined between the third and fourth bit lines.

2. The device of claim 1, further comprising:

a first sense amplifier with one terminal connected to the first bit line;

a second sense amplifier with one terminal connected to the second bit line;

a third sense amplifier with one terminal connected to the third bit line; and means for transferring data from the first to second memory array, or vice versa, the transfer means including first and second data transfer lines, wherein the first data transfer line is connected to the one terminal of the first sense amplifier and to the one terminal of the third sense amplifier via respective switches, and wherein the second data transfer line is connected to the other terminal of the second sense amplifier and to the other terminal of the third sense amplifier via respective switches.

3. The device of claim 1, wherein the first memory array is implemented as cache memory core, and wherein the second memory array is implemented as main memory core.

4. The device of claim 1, wherein the first memory array is implemented as register core, and wherein the second memory array is implemented as main memory core.

5. The device of claim 1, further comprising:

a first complementary bit line paired with the first bit line;

a second complementary bit line paired with the second bit line;

a first sense amplifier with one terminal connected to the first bit line and the other terminal connected to the first complementary bit line; and a second sense amplifier with one terminal connected to the second bit line and the other terminal connected to the second complementary bit line, wherein the first complementary bit line and the first bit line extend from the first sense amplifier in mutually opposite directions, and wherein second complementary bit line and the second bit line extend from the second sense amplifier in mutually opposite directions.

6. The device of claim 1, further comprising:

a first word line connected to respective gates of the first transistors;

a second word line connected to respective gates of the second transistors;

a third word line connected to respective gates of the third transistors; and a fourth word line connected to respective gates of the fourth transistors, wherein the first and second word lines are parallel to each other, and wherein the third and fourth word lines are parallel to each other, and wherein a pitch defined between the first and second word lines is equal to a pitch defined between the third and fourth word lines.

* * * * *